US007003377B2

United States Patent
Chang et al.

(10) Patent No.: US 7,003,377 B2
(45) Date of Patent: Feb. 21, 2006

(54) CONTROLLING COOLING AIR INTAKE FOR AIR COOLED EQUIPMENT

(75) Inventors: Shye-Bin S. Chang, Naperville, IL (US); Thomas C. Davis, Homer Glen, IL (US); Richard Warren Hemmeter, Naperville, IL (US)

(73) Assignee: Lucent Technologies Inc., Murray Hill, NJ (US)

(*) Notice: Subject to any disclaimer, the term of this patent is extended or adjusted under 35 U.S.C. 154(b) by 115 days.

(21) Appl. No.: 10/736,002

(22) Filed: Dec. 15, 2003

(65) Prior Publication Data

US 2005/0128703 A1 Jun. 16, 2005

(51) Int. Cl.
  G01M 1/38 (2006.01)
  G05B 13/00 (2006.01)
  G05B 15/00 (2006.01)
  G05B 21/00 (2006.01)
  G05B 23/00 (2006.01)

(52) U.S. Cl. .................... 700/276; 700/277; 700/278; 700/282; 700/210; 165/201; 165/265; 165/209; 165/217; 165/303; 236/113; 236/1 G

(58) Field of Classification Search ............... 700/275, 700/276, 277, 278, 282, 210; 236/18, 19; 165/201, 265, 209, 210, 217, 303
See application file for complete search history.

(56) References Cited

U.S. PATENT DOCUMENTS

| 4,630,221 | A | * | 12/1986 | Heckenbach et al. ........ 700/277 |
| 4,841,733 | A | * | 6/1989 | Dussault et al. ................ 62/93 |
| 5,179,524 | A | * | 1/1993 | Parker et al. ................ 700/277 |
| 5,341,988 | A | * | 8/1994 | Rein et al. .................. 236/49.3 |
| 5,449,112 | A | * | 9/1995 | Heitman et al. ............ 236/49.3 |
| 5,992,166 | A | * | 11/1999 | Tremblay ..................... 62/187 |
| 6,126,540 | A | * | 10/2000 | Janu et al. ................... 454/229 |
| 6,154,686 | A | * | 11/2000 | Hefferen et al. ............ 700/276 |
| 6,272,399 | B1 | * | 8/2001 | Fish et al. ................... 700/276 |
| 6,880,799 | B1 | * | 4/2005 | Mrozek ................. 251/129.12 |
| 2003/0065462 | A1 | * | 4/2003 | Polyrailo ...................... 702/81 |

* cited by examiner

*Primary Examiner*—Ramesh Patel

(57) ABSTRACT

A method and apparatus for supplying cooling air to electronic equipment from ones of at least two sources. A detector detects whether the quality, such as the temperature of the cooling air from a source, is satisfactory and if not shuts the damper to that source and opens the damper to another source. A main controller provides additional control signals for controlling the dampers to protect the electronic equipment, or for shutting down the electronic equipment.

16 Claims, 3 Drawing Sheets

CONTROLLING COOLING AIR INTAKE FOR AIR COOLED EQUIPMENT

TECHNICAL FIELD

This invention relates to apparatus and a method for controlling the choice of sources of cooling, filtered, and otherwise treated air for air cooled electronic equipment.

BACKGROUND OF THE INVENTION

Modern electronic equipment, such as equipment used for controls, frequently generates a large amount of heat in a relatively small volume. Such equipment is frequently cooled by forced cooling air supplied from air conditioning equipment.

In many applications such as monitoring equipment in hospitals there is a need for high reliability of the operation of the electronic equipment. In the prior art, the electronic equipment is cooled by a source of cool air that is common to a large number of units of the electronic equipment. A problem of the prior art is that there is no satisfactory arrangement for cooling the electronic equipment in the presence of failure of the source of the cooled air.

SUMMARY OF THE INVENTION

Applicants have solved this problem and made an advance over the teachings of the prior art in accordance with this invention wherein cooled air is supplied from at least two sources, the duct to each source having its own damper to shut off air from that source in case of trouble; the electronic equipment being controlled has sensors for detecting unsatisfactory conditions such as high temperature or excessive amounts of dust or other contaminants; a processor is used to take signals from these sensors and use them to control the dampers. Advantageously, this arrangement allows for a continuation of satisfactory performance of the electronic equipment when one of the sources of cool air is not performing satisfactorily.

In accordance with one specific implementation of Applicants' invention, two sources of cool air are connected to the electronic equipment, the duct to each source having a damper for shutting off the source to the electronic equipment. Normally, a single source is used and when there is a problem the damper to that source is closed and the damper for the alternate source is opened. The dampers are controlled by a processor which receives information from sensors for detecting trouble conditions in the flow from each of the two sources.

In accordance with one feature of Applicants' invention, a main controller system for controlling a group of individual units, such as the equipments for the rooms of a building or a floor of a hospital, is connected to the processor and can be used to balance the load on the two sources or to shut off the unit in order to make sure that even more vital units can continue to operate from a reduced source of cooling air.

In accordance with another feature of Applicants' invention, both dampers can be opened if a reduced amount of cooling air is available from both of the sources of cooling air.

In accordance with another feature of Applicants' invention, a main controller system can receive manual control information from a control console to override the damper control signals generated by the processor.

BRIEF DESCRIPTION OF THE DRAWING(S)

DETAILED DESCRIPTION

Figure 1:
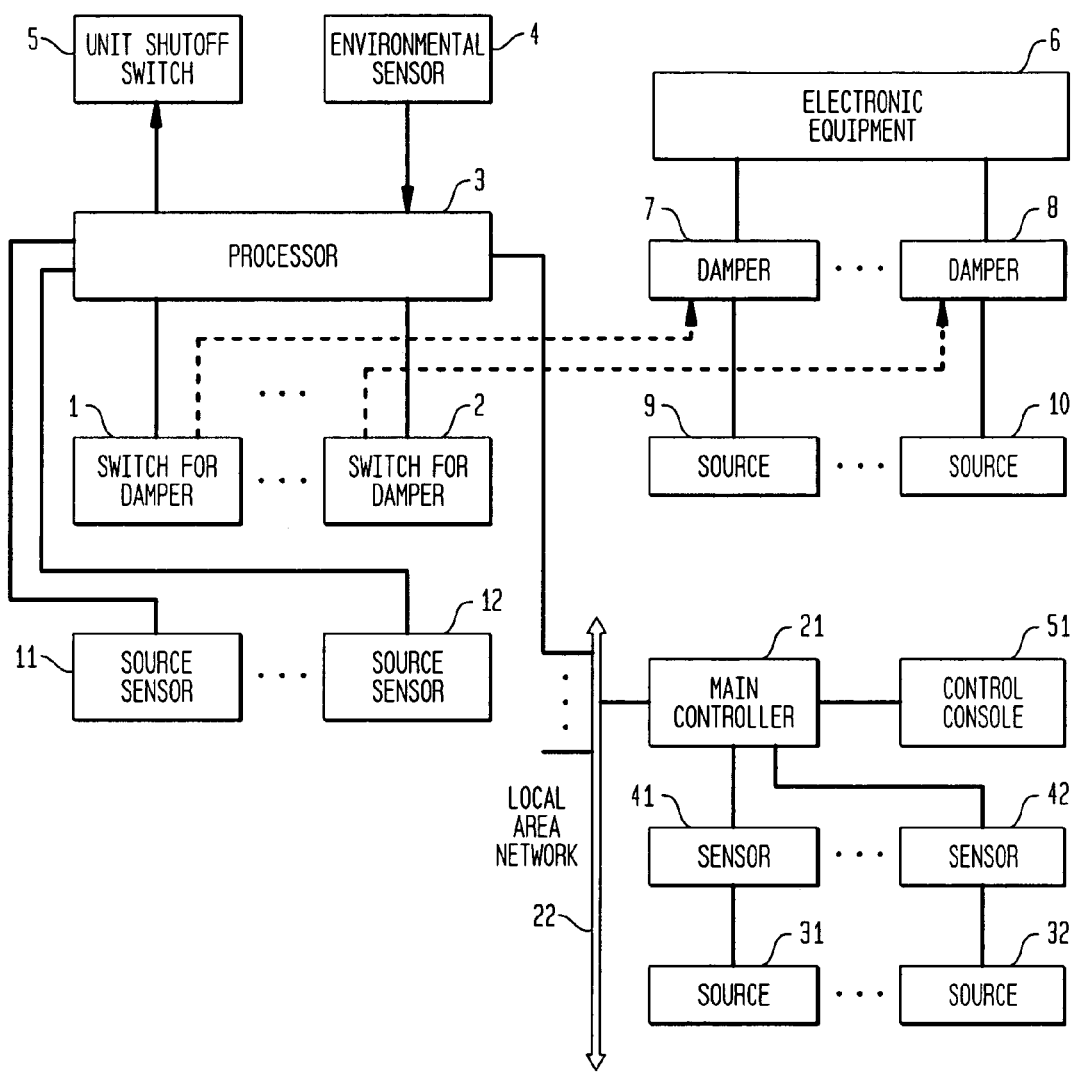
FIG. 1 is a block diagram illustrating the operation of Applicants' invention.

FIG. 1 is a block diagram illustrating the operation of Applicants' invention. Electronic equipment 6 receives cooling air from at least one of source 9, . . . ,10 through dampers 7, . . . ,8 respectively. Dampers 7, . . . 8 are controlled by switches 1, . . . ,2 the switches being controlled by processor 3. Source sensors 11, . . . ,12 detect problems in the air supply from sources 9, . . . ,10 respectively. When a sensor detects a problem and notifies processor 3, the processor may control one or both switches to place the dampers in a state to provide satisfactory cooling air to the electronic equipment. In one specific implementation of Applicants' invention the normal state is to have one of the sources provide all cooling air and to shut the damper to the other source. When the primary source does not produce satisfactory cooling air the damper for that source is closed and the damper for the other source is opened.

In addition, processor 3 receives an input from an environmental sensor 4 which detects conditions under which the electronic equipment should be shut off. In response to such signals processor 3 operates a unit shutoff switch 5 which turns off the electronic equipment 6. This allows for differential treatment of critical versus merely useful equipment items in case only back up power is available.

In addition, processor 3 is connected via a local area network 22 to a main controller 21. The main controller receives signals from all processors and transmits control signals to the processors. The main controller, for example, may decide that the amount of available cooling air is so low that only a few critical electronic equipments should continue to operate and can transmit shutoff signals to the processors associated with all but the few critical electronic equipments. The main controller has sensors 41, . . . ,42 for providing information about the sources 31, . . . ,32. Sources 31, . . . ,32 are the feeder sources for sources 9, . . . ,10. In addition, the main controller 21 can receive signals from a control console to allow manual override of signals generated by the main controller. For example, a control console 51 may decide that a particular unit of electronic equipment should not be shut down because of a hospital emergency condition associated with that unit.

Figure 2:
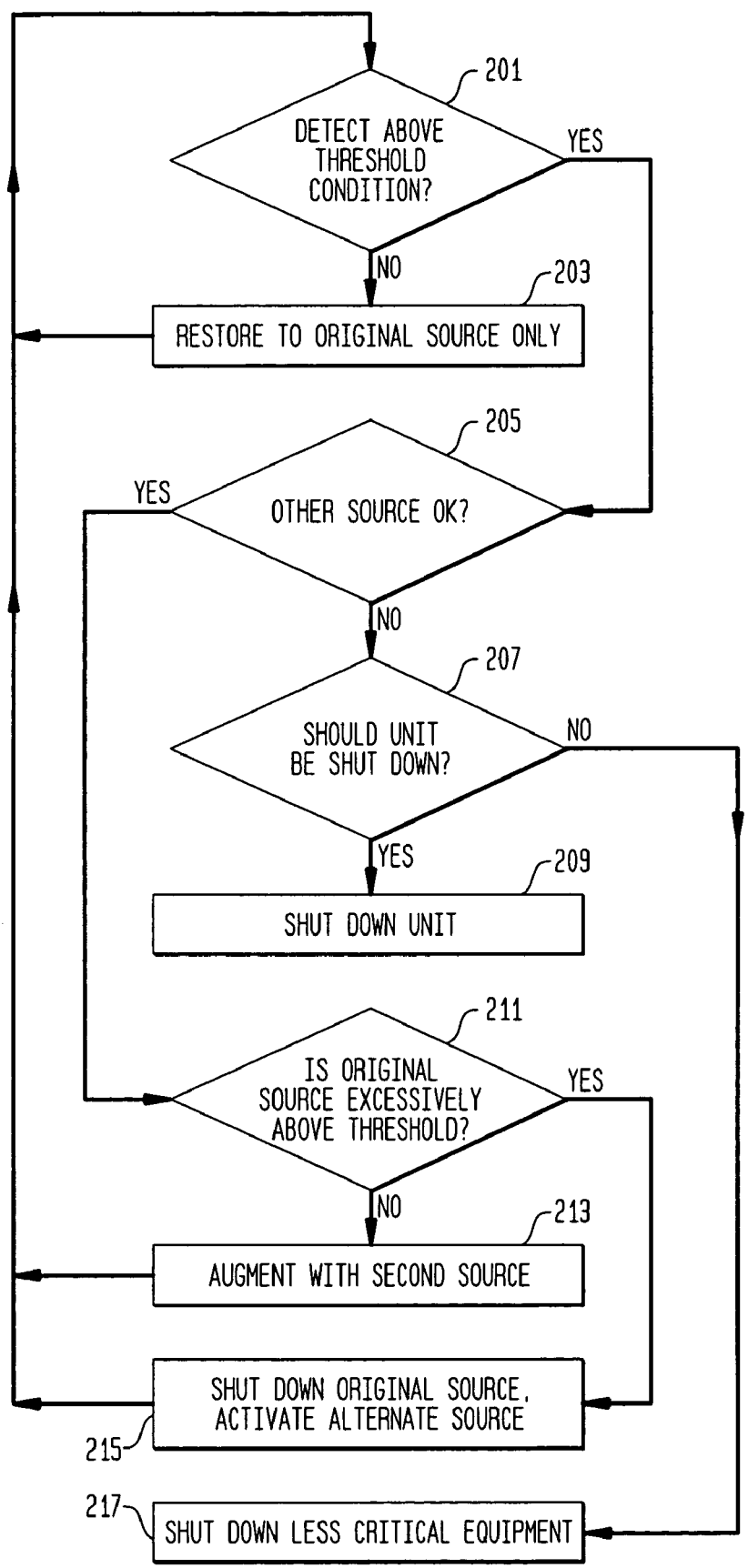
FIG. 2 is a flow diagram illustrating the operation of the local control of the dampers.

FIG. 2 illustrates the normal operation of the control system when the control system is associated with two sources of cool air. Test 201 is used to determine whether an above threshold condition, such as high temperature, exists in the source supplying cool air to the electronic equipment. If not, then the damper to permit air from the normal primary source is opened and the damper to admit air from an alternate source is closed (action block 203). If an above threshold condition has been detected, then test 205 is used to determine whether the alternate source is still supplying satisfactory cooling air. If the alternate source is unsatisfactory, then a test is made to determine whether the electronic unit should be shut down (test 207). If the result of test 207 is that the unit should be shut down, then the unit is shut down (action block 209) using, for example, the unit shutoff switch 5.

If test 205 determines that the other source of cooling air is satisfactory, then test 211 is used to determine whether the primary source is excessively above threshold. If test 211 determines that the primary source is not excessively above threshold, then the cooling air is augmented with the alternate source by opening the damper to the alternate source (action block 213). If test 211 indicates that the primary source is excessively above threshold, then the primary source is shut off and the damper to the alternate source is opened (action block (215). Following action blocks 213, 215 and 203, test 201 is reentered.

If the result of test 207 is negative, an attempt is made to shut down less critical equipment (action block 217). Test 207 is then re-entered.

Figure 3:
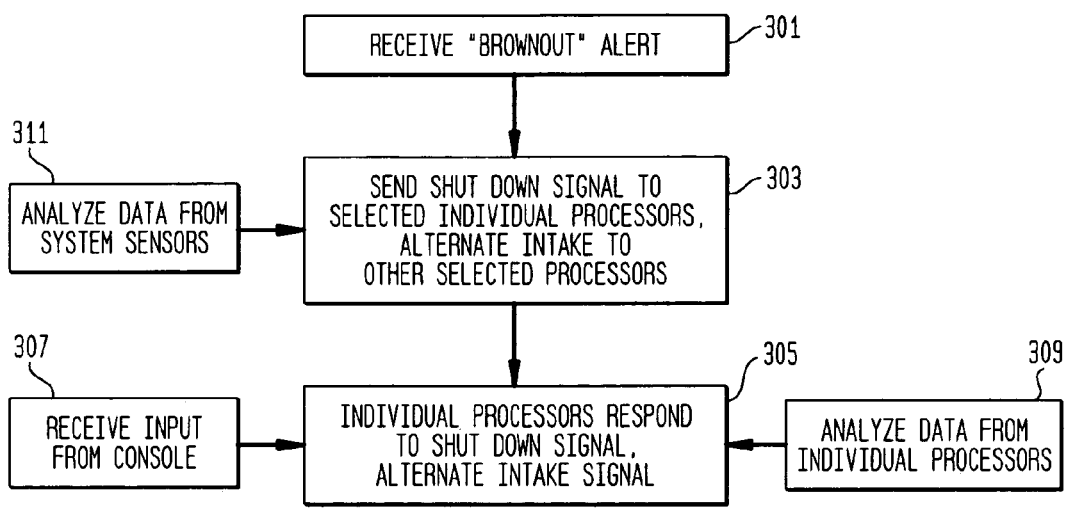
FIG. 3 is a flow diagram illustrating the operational control from a main controller.

FIG. 3 illustrates the operations of the processor. If the main controller 21 receives a brownout alert (action block 301) indicating that the air cooling load should be drastically reduced, then a shutoff signal is sent to preselected individual processors and an alternate intake activation signal is sent to other processors in an effort to lower the air cooling load of the entire system (action block 303). The individual processors then respond to the shutoff signals and the intake signals by shutting off electronic equipment or closing the damper to the main source and opening the damper to the alternate source of cooling air.

Action block 303 can also be entered in response to receiving an input from the console 51 (action block 307) or in response to the analysis of data from individual processors (action block 309). Action block 309 may be the result, for example, of receiving a large number of signals indicating that unsatisfactory cooling air is being received for individual electronic equipments. In addition, action block 303 can be entered from an analysis of signals from sensors 41, . . . ,42 indicating that sources 31, . . . ,32 are unsatisfactory (action block 311).

The above description is of one preferred implementation of Applicants' invention. Other implementations will be apparent to those of ordinary skill in the art without departing from the scope of the invention. The invention is limited only by the attached claims.

We claim:

1. Apparatus for cooling electronic equipment, comprising
   at least two sources of cool air;
   a damper in series with each of said sources;
   sensors to detect unsatisfactory cooling air being received from each of the sources;
   each damper controlled by a switch; and
   a processor responsive to signals from said sensors for controlling the operation of said dampers in such a way as to provide satisfactory cooling air to said electronic equipment.

2. The apparatus of claim 1 further comprising:
   a main controller for controlling a plurality of said apparatus for cooling electronic equipment, said main controller for providing over-ride signals to the processors of each of said apparatus to ensure that special critical equipment is adequately cooled in the presence of adverse conditions.

3. The apparatus of claim 2 further comprising:
   a control console for applying control signals to said main controller.

4. The apparatus of claim 2 wherein said main controller responds to a brownout signal by sending equipment shut down signals to preselected ones of said plurality of apparatus.

5. The apparatus of claim 2 wherein said main controller responds to a brownout signal by sending damper control request signals to preselected ones of said plurality of apparatus.

6. The apparatus of claim 1 further comprising:
   a shutoff switch to cause said processor to shut down said electronic equipment.

7. The apparatus of claim 1 wherein only one of said damper switches is normally open.

8. The apparatus of claim 7 wherein two of said damper switches can be open.

9. A method for cooling electronic equipment, comprising:
   providing at least two sources of cool air;
   providing a damper in series with each of said sources;
   detecting unsatisfactory cooling air being received from each of the sources by means of sensors;
   controlling each damper by a switch; and
   responsive to signals from said sensors, analyzing said signals for controlling the operation of said dampers in such a way as to provide satisfactory cooling air to said electronic equipment.

10. The method of claim 9 further comprising:
    providing a main controller for controlling a plurality of said apparatus for cooling electronic equipment, for generating over-ride signals to ensure that special critical equipment is adequately cooled in the presence of adverse conditions.

11. The method of claim 10 further comprising:
    applying control signals to said main controller from a control console.

12. The method of claim 10, further comprising the step of:
    responding to a brownout signal by sending equipment shut down signals to preselected apparatus.

13. The method of claim 10 wherein said main controller responds to a brownout signal by sending damper control request signals to preselected apparatus.

14. The method of claim 9 further comprising:
    operating a shutoff switch to cause said electronic equipment to be shut down.

15. The method of claim 9 wherein only one of said damper switches is normally open.

16. The method of claim 15 wherein two of said damper switches can be open.

* * * * *